(12) United States Patent
Oki et al.

(10) Patent No.: US 7,213,980 B2
(45) Date of Patent: May 8, 2007

(54) INTELLIGENT OPTICAL TRANSCEIVER WITH PLUGGABLE FUNCTION

(75) Inventors: Kazushige Oki, Yokohama (JP); Hiromi Kurashima, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/116,435

(22) Filed: Apr. 28, 2005

(65) Prior Publication Data
US 2005/0286838 A1 Dec. 29, 2005

Related U.S. Application Data

(60) Provisional application No. 60/632,194, filed on Dec. 2, 2004, provisional application No. 60/566,075, filed on Apr. 29, 2004.

(51) Int. Cl.
*G02B 6/36* (2006.01)
(52) U.S. Cl. .................. 385/92; 385/88; 385/89; 385/94
(58) Field of Classification Search .............. 385/92, 385/88, 89, 94
See application file for complete search history.

(56) References Cited

U.S. PATENT DOCUMENTS

| | | | |
|---|---|---|---|
| 5,980,118 A * | 11/1999 | Henningsson et al. ........ 385/88 |
| 6,371,787 B1 | 4/2002 | Branch et al. | |
| 6,430,053 B1 * | 8/2002 | Peterson et al. ............ 361/728 |
| 6,439,918 B1 * | 8/2002 | Togami et al. .............. 439/372 |
| 6,459,918 B1 | 10/2002 | Tegashi et al. | |
| 6,824,416 B2 * | 11/2004 | Di Mascio ................ 439/352 |
| 6,846,115 B1 * | 1/2005 | Shang et al. ................. 385/92 |
| 6,935,882 B2 * | 8/2005 | Hanley et al. .............. 439/372 |
| 7,023,703 B2 * | 4/2006 | Peloza ....................... 361/727 |
| 7,090,523 B2 * | 8/2006 | Shirk et al. ................. 439/352 |
| 2003/0171022 A1 * | 9/2003 | Distad et al. ............... 439/372 |
| 2005/0226571 A1 * | 10/2005 | Malagrino et al. ............ 385/92 |
| 2005/0281514 A1 * | 12/2005 | Oki et al. ..................... 385/92 |
| 2005/0286837 A1 * | 12/2005 | Oki et al. ..................... 385/92 |

OTHER PUBLICATIONS

Copending U.S. Appl. No. 11/115,388, filed Apr. 27, 2005, "Pluggable Optical Transceiver With Intelligent Latching/Releasing Mechanism".
Copending U.S. Appl. No. 11/115,392, filed Apr. 27, 2005, "Pluggable Optical Transceiver With Highly Shielded Structure".
Copending U.S. Appl. No. 11/117,695, filed Apr. 29, 2005, "Releasing Mechanism Of Pluggable Transceiver".

* cited by examiner

*Primary Examiner*—Michelle Connelly-Cushwa
*Assistant Examiner*—Rhonda S. Peace
(74) *Attorney, Agent, or Firm*—Smith, Gambrell & Russell, LLP

(57) ABSTRACT

Disclosed herein is an intelligent pluggable transceiver improving an EMI tolerance with a simple mechanism. The optical transceiver includes upper and lower housings, a holder, optical assemblies, a cover, a substrate and a grip. The optical assemblies are fixed with the upper and lower housings together with the holder with interposing the conductive elastic member. Although the rear end of the substrate is exposed outside the transceiver, the shield bracket and the ground pattern on the substrate shields the contact portion between the substrate and the upper housing and between the substrate and the cover. Moreover, the grip and the latch lever installed in the lower housing, and the elastic piece realize the latching/releasing mechanism of the transceiver with the host system.

9 Claims, 14 Drawing Sheets

INTELLIGENT OPTICAL TRANSCEIVER WITH PLUGGABLE FUNCTION

RELATED APPLICATIONS

This application claims benefit of a provisional application Ser. No. of 60/566,075, filed Apr. 29, 2004, and a provisional application Ser. No. of 60/632,194, filed Dec. 2, 2004.

BACKGROUND OF THE INVENTION

1. Field of the Invention

The present invention relates to a configuration of a pluggable optical transceiver and a manufacturing method of the transceiver, in particular, the present invention relates to an intelligent pluggable optical transceiver.

2. Related Prior Art

Several standards have been ruled for an optical transceiver comprising a light-receiving portion for converting an optical signal into an electrical signal and processing thus converted electrical signal, a light-transmitting device for converting an electrical signal into an optical signal and emitting thus converted optical signal to an optical fiber, and an optical receptacle for receiving an optical connector securing the optical fiber thereto, and many products conforming such standards have been already delivered. The standards above mentioned rules mechanical and electrical specifications such as the transmission rate, the electronic specification of the signal level and the timing, the outline dimension, the robustness, the pin-assign for interfacing with the outside, the specification of the optical connector and the optical receptacle, and the mechanism to be installed on the host system. For example, the SFF-MSA (Small Form Factor Multi-Source Agreement) and X2-MSA are well known. These transceivers have the pluggable configuration, in which the transceiver can be exchanged as the power supply of the host system is put on.

Several U.S. patents, for example, U.S. Pat. No. 6,459,918 or U.S. Pat. No. 6,371,787, have disclosed such pluggable transceivers. However, the standards mentioned above have a primary purpose to provide a compatibility of the transceivers, inner configurations, such as the inner mechanical structure and the inner electronic performance, may be optional within the scope of the rule and are not unchangeable. The present invention presents, for such pluggable transceivers, new structures, functions, and results.

SUMMARY OF THE INVENTION

An optical transceiver according to the present invention is the transceiver to engage in pluggable with the rail of the host system. The optical transceiver comprises a loser housing, an upper housing, an optical assembly, a holder, and a grip. The lower housing has a mechanism for engaging this optical transceiver with the rail of the host system and installs the holder to fix the optical assembly and to latch the optical connector. The upper housing forms an optical receptacle together with the lower housing. The grip is assembled with the optical receptacle such to surround the optical receptacle and to be capable of sliding along a direction where the optical connector is to be inserted, namely, along an optical axis of the optical assembly and the optical connector. The latching mechanism releases the engagement of the transceiver with the rail operating together with the sliding of the grip.

The latch mechanism includes a pair of latch levers and a pair of elastic pieces, which are set in both sides of the lower housing. The latch lever has a pivot, a sliding end and a hooking end opposite to the sliding end with respect to the pivot. The elastic piece pushes the hooking end of the latch lever toward outside of the optical transceiver. The hooking end may be pulled inside by the seesaw motion of the latch lever as the sliding end moves working with the slide of the grip. That is, the grip provides a plane inclined toward the optical receptacle, and, by moving of the sliding end of the latch lever on this inclined plane cooperating with the pulling of the grip, this sliding end is pushed outward of the transceiver. Then, by the lever action, the hooking end of the latch lever is pulled inside of the transceiver. Therefore, the engagement of the hooking end with the rail of the host system can be released.

Further, when the optical transceiver is free from the rail and does not mate with the optical connector, the grip may take the closest position to the optical receptacle, where the initial position thereof, by the function combined with the elastic piece, the latch lever, and the inclined surface of the grip. The latch lever includes an arm connecting the pivot thereof to the sliding end. The arm has a convex shape toward outside of the optical transceiver, which increases the contact angle of the sliding end with respect to the inclined surface of the grip and automatically recovers the initial position of the grip.

The hooking end of the latch lever provides a hook formed by a first surface connecting to the pivot and a second surface engaging with the rail. When the hook engages with the rail, the first surface makes an angle to the second surface greater than a right angle and smaller than a right angle added with an angle between the first surface and the rail. Accordingly, the transceiver can be not released from the rail without operating the grip, while can be easily released therefrom by the pivoting of the latch lever with operating the grip. Moreover, the tip of the hooking end shapes an acute angle with an interval between hooking ends narrower than the interval of the rails, which enables the transceiver to insert into the rail with ease.

Moreover, the optical transceiver of the present invention may provide a stopper mechanism between the grip and the optical receptacle not to release the grip therefrom. That is, the grip may provide an opening on each side wall thereof, on the other hand the receptacle may provide a projection on each side wall thereof to engage with the opening of said grip. To engage the projection of the receptacle with the opening of the grip may effectively prevent the grip from dispersing the receptacle.

The grip may provide a projection to be hooked with the optical connector inserted into the receptacle. When the optical transceiver engages with the rail with the optical connector being inserted into the optical receptacle, the transceiver must not disengage with the rail. Therefore, by forming the projection in the grip, even the grip is tried to slide this side to release the transceiver from the rail, this projection prevents the grip from sliding to release the engagement between the latch lever and the rail, because the projection is hooked with the optical connector and the optical connector is latched with the holder in the receptacle. That is, in the case that the optical transceiver receives the optical connector, the grip can not slide, which means that the transceiver must not disengage with the rail.

In the present optical transceiver, the lower housing may include a latch mechanism receiving portion in an outer side of the lower housing. The latch mechanism receiving portion includes an exterior wall and a front wall. The hooking end of the latch lever extrudes from the exterior wall to engage with the rail. The sliding end of the latch lever extrudes from the front wall to co-operate with the grip, which enables the latch lever to pivot as the grip slides. The elastic piece may be a leaf spring made of stainless steel in the present invention.

BRIEF DESCRIPTION OF DRAWINGS

FIG. 5A is a perspective diagram of the lower housing viewed from one direction, while

FIG. 11A shows a mechanism for electromagnetic shielding around the an electrical plug.

EXPLANATIONS OF PREFERRED EMBODIMENTS

Next, as referring to accompanying drawings, structures, manufacturing methods and functions of the present optical transceiver will be described.

Figure 1:
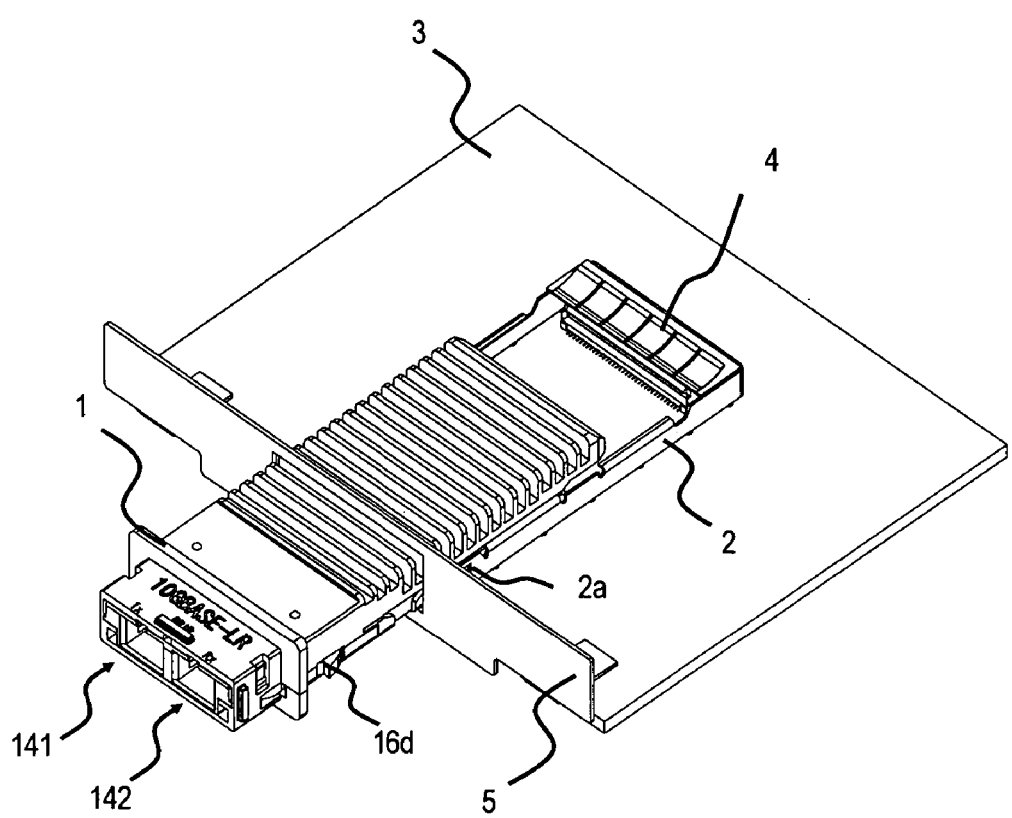
FIG. 1 shows an optical transceiver according to the present invention put on the rail of the host system.

FIG. 1 shows an optical transceiver 1 of the present invention installed on the host substrate 3. The host substrate 3 provides a face panel 5 with an opening into which the transceiver passes. The rail 2 on the host substrate 3 connects to this opening of the face panel 5 such that the transceiver 1 is inserted into the rail 2 by passing through the opening of the face panel 5. The rear of the rail 2 installs a connector 4 that electrically connects the transceiver to the host substrate 3.

Both the side of the rail 2 and the side of the transceiver provide latch mechanisms, 2a and 16d, respectively. The latch mechanism is that the transceiver 1 can not released from the rail 2 until some action is operated therebetween after the transceiver is inserted thereinto and an electrical plug formed in the rear of the transceiver 1 mates with the electrical connector 4 on the host substrate 3. In particular, when receptacles, 141 and 142, of the transceiver 1 receive an optical connector, the rail 2 must not release the transceiver 1. Here, in throughout the explanation, the front side of the transceiver 1 is a side where the receptacles, 141 and 142, are formed while the rear side thereof is a side opposite thereto for the sake of convenience. These are not absolute.

Figure 2:
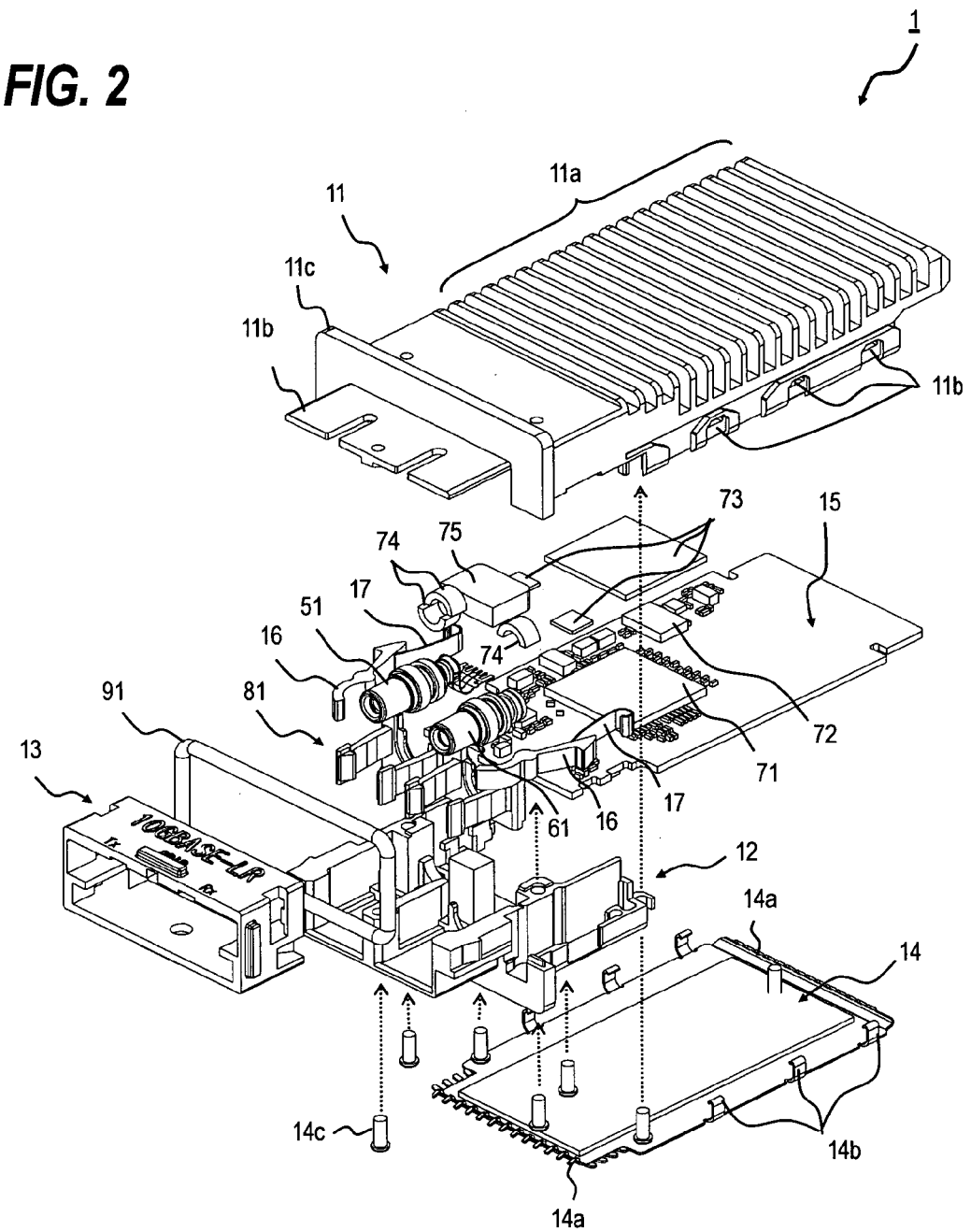
FIG. 2 is an exploded view showing the optical transceiver of the present invention.

FIG. 2 is an exploded view of the transceiver 1. Two optical subassemblies, which are denoted as the OSA, 51 and 61, have a so-called co-axial package. One of the OSA is a receiving optical subassembly (ROSA) with a light-receiving device such as photodiode, while the other is a transmitting optical subassembly (TOSA) with a light-emitting device such as laser diode. The transceiver 1 comprises, these two OSAs as the core, a holder 81 for holding and fixing these two OSAs, a lower housing 12, a substrate mounting an integrated circuit (IC) to communicate with these two OSAs, an upper housing 11 putting the substrate 15 between the lower housing 12, a cover 14, and grip 13 for releasing the transceiver 1 from the rail 2. A tip of respective OSAs, 51 and 61, extrudes into each space, i.e., respective receptacles, formed in the front of the transceiver 1 by the upper and lower housings, 11 and 12, and mate with the optical connector there. The optical connector is not shown in the figure. The upper housing 11 provides structures similar to those provided in the lower housing 12 to fix the holder 81 therebetween. The lower housing 12 is assembled with the upper housing 11 by a plurality of screws 14c to sandwich the substrate 15.

A FPC (Flexible Printed Circuit) board connects the subassemblies, 51 and 61, to the substrate 15. A plurality of lead pins extrudes from the stem provided in the rear of the OSAs, 51 and 61. The configurations of the FPC board are determined in an end portion thereof such that these lead pins pass through corresponding via holes. The other side of the FPC board, which is connected to the substrate, has an interdigital shape to connect each comb on the substrate with solder. Although not shown in FIG. 2 explicitly, the substrate 15 forms, in the rear end thereof, an electrical plug with a plurality of wiring patterns. The transceiver 1 may communicate with the host system by mating this electrical plug with the electronic connector 5 provided on the host board.

The IC 71 mounted on the substrate includes circuits, for example, to receive a signal from the ROSA 51, to divide a clock signal from a data signal involved in the received signal, to convert the data signal in serial-to-parallel with a width of 4 bit or 8 bit, and to output the digital data to the outside of the transceiver 1. The IC is in thermally contact to the upper housing 11 via a heat-dissipating sheet 73, and the upper housing 11 provides thermal fins 11a in the whole of the outer surface thereof. Accordingly, an effective heat dissipation pass can be formed from the IC 71 to the outside of the transceiver 1. Other heat-dissipating sheets are provided for a main amplifier mounted just behind the ROSA 51 for the receiver, and for a driver mounted behind the TOSA 61 for the transmitter. Moreover, an area where the circuit of the transmitter is formed, in particular around the driver, has a microwave absorber 75 thereon, which reduces an electromagnetic interference (EMI) noise due to the radiation from the transmitter to the peripheral thereof. The cover 14 covers the bottom of the substrate 15. The cover 14 is fitted to the upper housing 12. In FIG. 2, the transceiver 1 has the cover 14 independent on the lower housing 12. However, a united configuration, i.e., the cover 14 extends to the lower housing 12 and forms the receptacle at the front of the transceiver 1, may be applicable.

The upper housing 11 is made of die casting aluminum (Al) coated with nickel (Ni), while the lower housing 12 is made of die casting zinc (Zn) coated with copper (Cu) and nickel (Ni). The cover is made of copper (Cu) coated with nickel (Ni). The grip 13 and the holder 81 are made of resin. For the holder 81, the resin coated with nickel (Ni) and copper (Cu) is used. However, the materials for each part are not limited those listed above as long as these parts and materials appear their functions and results. Next, the details of the present transceiver 1 will be described based on the manufacturing process thereof.

a. Assembly of the ROSA 51/TOSA 61

Figure 3A:
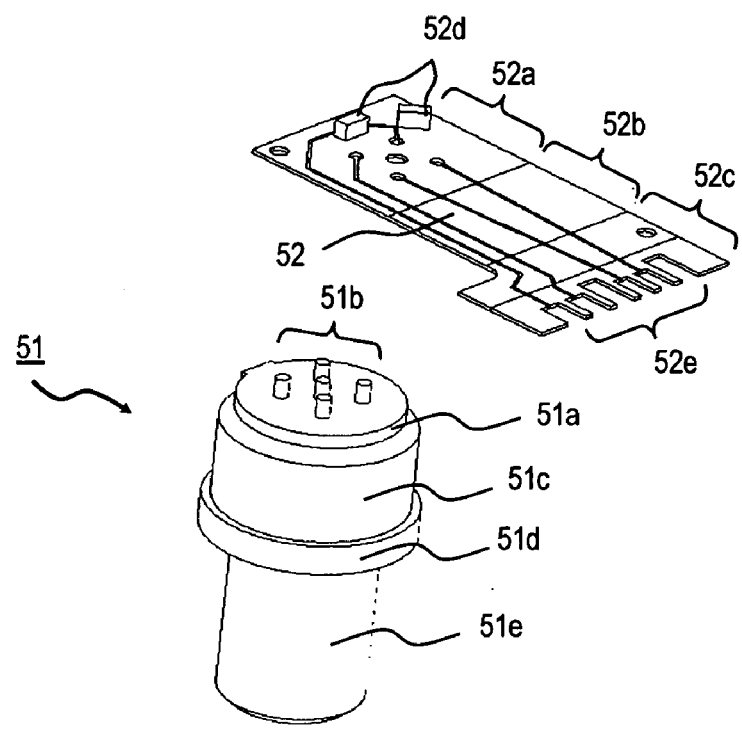
FIG. 3A shows a receiving optical subassembly installed on the present optical transceiver and an FPC board connected to the receiving optical subassembly.
Figure 3B:
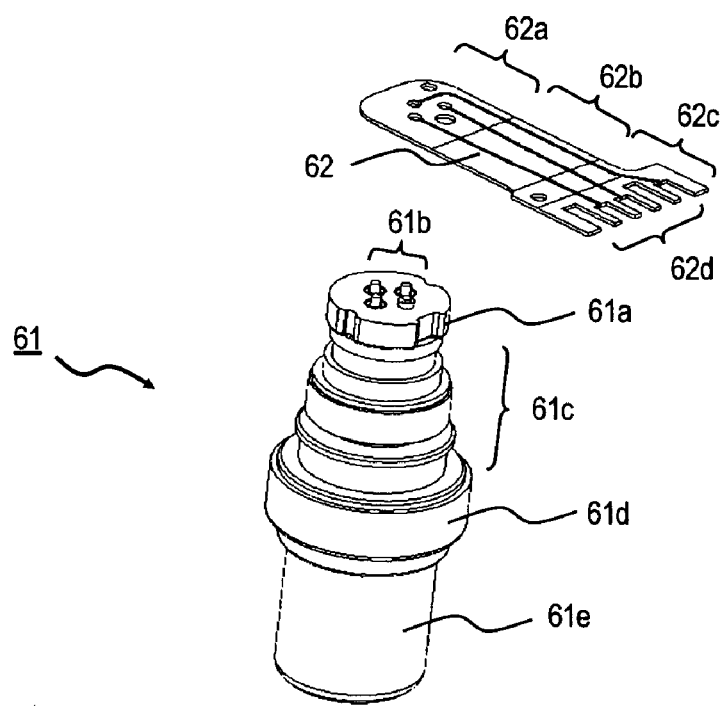
FIG. 3B shows a transmitting optical subassembly installed on the present optical transceiver and an FPC board connected to the transmitting optical subassembly.

FIG. 3A and FIG. 3B show exploded view of the ROSA 51 and the TOSA 61, respectively. The ROSA 51 and the TOSA 61 have a cylindrical package structure with alignment members, 51c and 61c, and sleeves, 51e and 61e, in forward ends thereof, downward in FIG. 3A and FIG. 3B. By inserting a ferrule attached to an end of the optical connector, which secures an optical fiber in a center portion of the ferrule, into the sleeves, 51e and 61e, the optical fiber in the ferrule and semiconductor devices such as PD and LD mounted on stems, 51a and 61a, can optically couple with each other. The alignment members, 51c and 61c, and the sleeves, 51e and 61e, constitute an optical coupling portion.

The alignment members, 51c and 61c, adjust the relative position between the semiconductor device and the ferrule, i.e., the optical fiber. Assuming a virtual line connecting the center of the optical fiber to the semiconductor optical device is the optical axis, the alignment member optical aligns between the ferrule and the optical device in X, Y, and Z direction, and in R rotation. Accordingly, the alignment members, 51c and 61c, comprises a plurality of members capable of aligning relative positions therebetween, and are rigidly fixed with each other after the aligning. The sleeve and the alignment member may be made of resin or metal. In case of resin, an adhesive, without distinction of thermosetting adhesive or thermosetting adhesive together with ultraviolet curing adhesive, may glue the members. On the other hand, in case of metal, the YAG laser welding may fix members. The stems, 51a and 61a, are generally made of metal. The stems, 51a and 61a, are fixed by, for example, the projection welding with the alignment members, 51c and 61c, as keeping the hermetically sealing.

A plurality of lead pins, 51b and 61b, extrude from the stems, 51a and 61a, respectively in the ROSA 51 and the TOSA 61. The ROSA 51 has five lead pins 51b, while the TOSA 61 has three lead pins 61b. In the ROSA 51, the center lead pin directly attaches to the stem 51a, which is the ground lead, and rest lead pins are assigned for the output of the complementary signal (Out, /Out) and two power lines, Vcc and Vpd, respectively. The former power line, Vcc, is for the pre-amplifier installed within the ROSA 51, while the latter power line, Vpd, is the bias line for the light-receiving device. Two output signals, Out and /Out, are complementary to each other, i.e., the phases is different by 180 degree to each other. These four lead pins are electrically isolated from the stem 51A. Three lead pins in the TOSA 61 are the ground lead, GND, the signal lead, Sig, and the output of the monitoring signal, Mon, respectively. The signal, Sig, is a driving signal of the light-transmitting device installed within the TOSA 61. The signal, Mon, corresponds to the monitoring signal output from the light-receiving device within the TOSA 61, which monitors a portion of the optical output emitted from the light-transmitting device.

Two types of the FPC board, 52 and 62, are prepared for the ROSA 51 and the TOSA 61, respectively. One end thereof forms a plurality of via holes, whose count and positions correspond to the lead pins of the ROSA 51 and the TOSA 61. Interconnections extend from each via hole toward the other end of the FPC board, and reach corresponding electrodes, 52e and 62d. These electrodes, 52e and 62d, comes in contact with corresponding electrodes provided on the substrate 15, accordingly, optical devices within the subassemblies may communicate with the electronic circuit on the substrate. The electrodes, 52e and 62e, have a comb shape to enhance their flexibility when the electrodes are attached to the substrate, thereby increasing the reliability in the connection. The shape of the electrodes may be ordinal shape, i.e., may be ordinal flat shape.

It is preferable for two interconnections transmitting the complementary signal output from the ROSA 51 to ensure the impedance matching condition by forming, for example, a micro strip line. That is, forming the interconnection for the low impedance signal, such as ground or power line, in the whole surface of the FPC boards, 52 and 62, opposite to that forming the signal line, two interconnections have predetermined widths depending on the thickness and the dielectric constant of the FPC board. Thus, the instability of the high frequency signal transmitted on the interconnection can be prevented. When the micro strip line can not be formed on the FPC boards, 52 and 62, due to the material or the dielectric constant of the material or the thickness thereof, the interconnection can apply the co-planar configuration. Moreover, bypassing capacitors 52 are effective to lower the transmission impedance of interconnections, such as the ground line and the power lines, Vcc and Vpd, except for the signal lines. FIG. 3A appears two bypassing capacitors.

The optical assemblies complete by inserting lead pins of the ROSA 51 and the TOSA 61 into the via-holes of the FPC boards, 52 and 62, and connecting them mechanically and electrically by soldering. Here, a support member made of polymide and thickness of about 0.2 mm is preferably inserted between the FPC boards, 52 and 62, and the lead pins, 51b and 61b, to enhance the connection strength. The supper member provides via holes in positions corresponding to that of the lead pins, 51b and 61b.

b. Assembly of the ROSA 51/TOSA 61 with the Circuit Board

Figure 4:
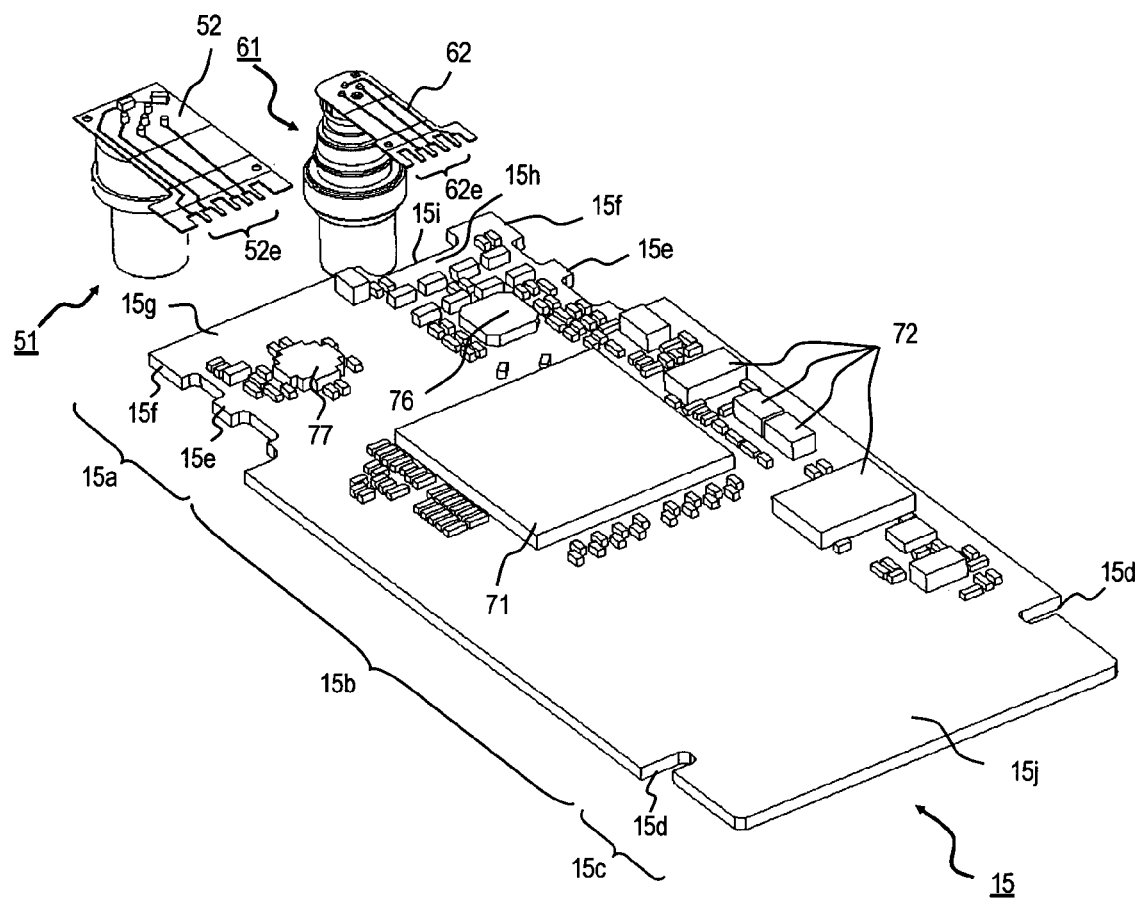
FIG. 4 shows a step for connecting the transmitting optical subassembly and the receiving optical subassembly, both provided with FPC boards, to a circuit board.

Next, as shown in FIG. 4, the ROSA 51 and the TOSA 61 with respective FPC boards, 52 and 62, are attached to the substrate 15. The FPC board extending form the ROSA 51 is in contact with a front-end portion 15g of the substrate 15. While, the other FPC board 62 extending from the TOSA 61 is soldered in a region 15h just behind a stand back portion 15i. In soldering, surfaces of the FPC boards, 52 and 62, opposite to those appeared in FIG. 4 are attached to the substrate 15. Interconnections on the FPC boards, 52 and 62, are brought to the soldering pads formed in the opposite surface of the FPC boards, 52 and 62, by via holes, and these soldering pads comes in contact with pads provided on the substrate 15.

The substrate 15 mounts in advance a LD driver 76 for driving the LD, a main amplifier 77, an IC 71 for parallel-to-serial or serial-to-parallel converting, and a plurality of electrically passive elements 72, and these electrical devices are connected with interconnections. Although FIG. 4 shows a configuration that only one surface of the substrate 15 mounts devices, the back surface not illustrated in FIG. 4, may also mount the electrical devices. On the rear end of the substrate 15 is provided with an electrical plug 15j formed by patterning of interconnections. By mating this electrical plug 15j with the electrical connector provided in the host substrate 3, the transceiver 1 can communicate with the host system.

On the front sides of the substrate 15 is provided with a plurality of projections, 15e and 15f, while on the read sides thereof is formed with a notch 15d. The front projections, 15e and 15f, are formed for setting the substrate 15 to the lower housing 12. The rear notch is provided for setting the substrate 15 to the upper housing 11.

c. Assembly of the ROSA 51/TOSA 61 with the Lower Housing

Figure 5A:
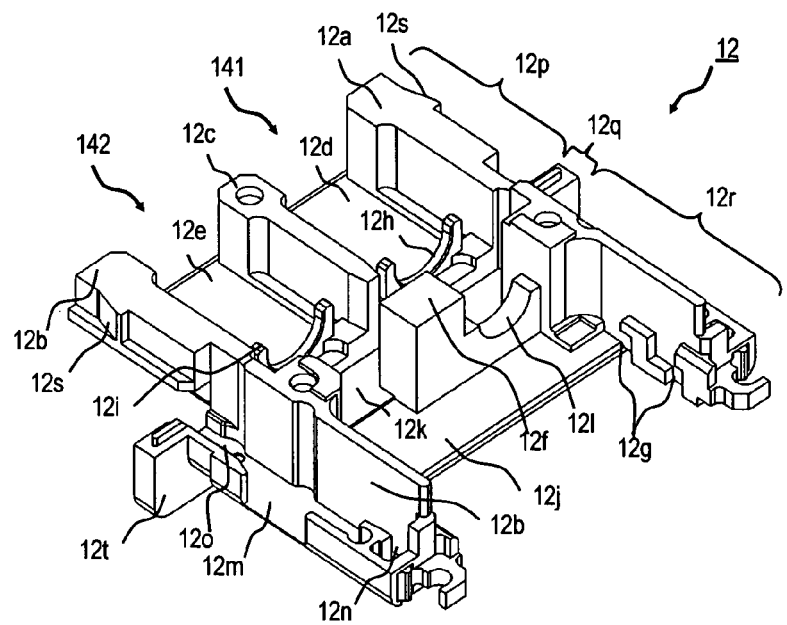
Figure 5B:
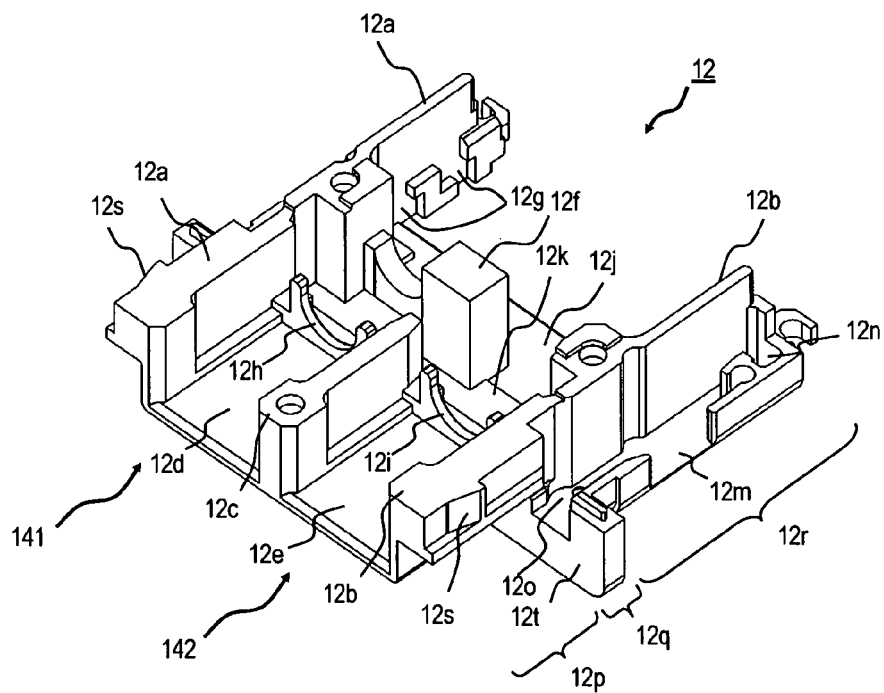
FIG. 5B is a perspective diagram of the lower housing viewed from another direction.

The lower housing may be assembled independent of the assembly of the ROSA 51 and the TOSA 61 with the substrate 15. FIG. 5A is a perspective diagram of the lower housing 12 viewed from one direction, and FIG. 5B is a perspective diagram thereof viewed from a direction different to that of FIG. 5A. The lower housing 12 arranges, from the front to the rear, a receptacle portion 12p, a holder-receiving portion 12q and an assembly-receiving portion 12r. The receptacle portion 12p forms a receptacle with openings, 141 and 142, and surrounded by outer walls, 12a and 12b, a center partition 12c and bottom plates, 12d and 12e, of the lower housing 12. Inserting the optical connector into the receptacle from the openings, 141 and 142, the sleeves, 51e and 61e, protruding from the ROSA 51 and the ROSA 61 installed on the assembly-receiving portion 12r, can mate with the optical connector to couple the optical device within the assemblies with the optical fiber secured in the optical connector. The outer walls, 12a and 12b, forms a projection 12s to engage the grip 13 with the lower housing 12, which prevents the grip 13 from falling off from the lower housing 12.

The assembly-receiving portion 12r installs the ROSA 51 and the TOSA 61 each having FPC boards, 52 and 62. The assembly-receiving portion 12r for the TOSA 61 provides a saddle 121 to continue from a center post 12f. As shown in FIG. 3A and FIG. 3B, the alignment member 61c of the TOSA 61 is longer than that of the ROSA 51. This is due to the TOSA 61 requires the alignment accuracy severer than that necessary for the ROSA 51. The alignment accuracy for the ROSA 51 is that the light emitted from the tip of the optical fiber enters the optically sensitive area with a diameter of a few tenth micron meters of the light-receiving device. On the other hand, the alignment accuracy for the TOSA 61 is that the light emitted from the light-transmitting device enters the core with a diameter of a few micron meters of the optical fiber. Accordingly, the length of the alignment member of the TOSA 61 is inevitably longer than that of the ROSA 51, which brings inferior mechanical robustness. Accordingly, by positioning the alignment member of the TOSA 61 on the saddle 121, the robustness may be reinforced. Moreover, the bush 74 supports the alignment member 61c of the TOSA 61, which enhances the heat dissipation from the TOSA 61. The bush 74 may be made of the same material as the heat-dissipating sheet 73 and has a curved surface to follow the TOSA 61.

Outer walls, 12a and 12b, of the assembly-receiving portion 12r forms a hooked groove 12g in the inner surface thereof. As already explained in FIG. 4, inserting projections, 15e and 15f, formed in the front side of the substrate 15 into this hooked groove 12g and pulling the substrate 15 backward, the front end of the substrate 15 is not raised upward. In the present transceiver 1, the connection of the ROSA 51 and TOSA 61 to the substrate 15 is performed by the FPC boards, 52 and 62. Although the FPC boards, 52 and 62, are flexible, the connecting portions to the substrate 15 or to the lead pins are most vulnerable. The configuration that the substrate 15 is not raised up due to the engaging structure between the hooked groove 12g and projections, 15e and 15f, enhances the reliability of the connecting portion from the mechanical view point, which is the weak point of the FPC board.

Figure 7A:
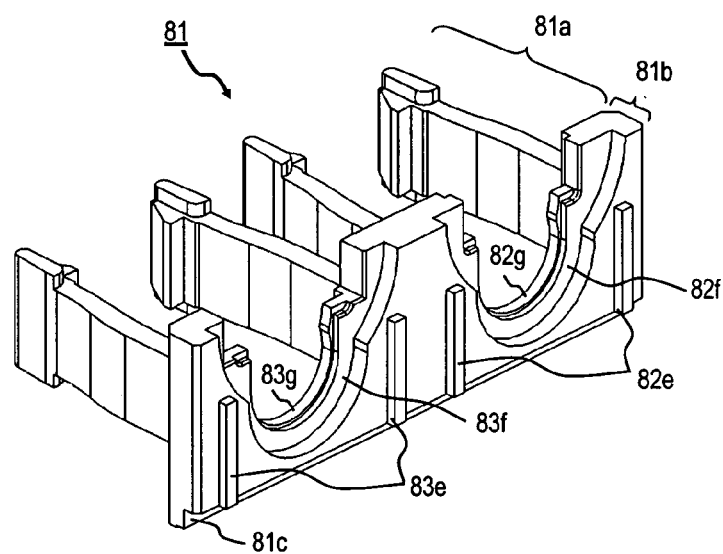
FIG. 7A is a perspective diagram of a holder constituting the optical transceiver of the invention viewed from one direction.

The holder-receiving portion 12q forms a pair of stoppers, 12h and 12i, a cross section of which is concave, to partition the receptacle portion 12p from the holder-receiving portion 12q. These stoppers, 12h and 12i, define the position of the ROSA 51 and the TOSA 61 along the optical axis (Z-direction) by abutting against the flanges, 51d and 61d, provided in the outer surface of the ROSA 51 and the TOSA 61. That is, the positions of the ROSA 51 and the TOSA 61 are determined such that the side surfaces of the flanges, 51d and 61d, which face the sleeve, abut against these stoppers, 12h and 12i, while, the other surfaces facing the stem are sandwiched by the surfaces, 82d and 83d, of the holder 81, as shown in later explanation for FIG. 7B. Moreover, as shown in FIG. 7A, ribs, 82e and 83e, formed in the holder 81 abut against the posts provided in both side walls of the lower housing 12 and against the side surface of the center post 12f. Here, by setting the amount of the thickness of the flanges of the ROSA 51 and the TOSA 61, that of the holder 81, and the height of the rib is slightly greater than the width of the hollow 12k of the holder-receiving portion 12g, the ROSA 51 and the TOSA 61 are not loose within the hollow 12k.

The holder-receiving portion 12q provides a front panel to extend the both sides thereof. The front panel 12t forms a flange to surround the whole peripheral of the openings, 141 and 142, when the upper housing 11 engages with the lower housing. The projection formed on the top surface of this panel 12t, by mating with the notch formed in the flange 11c of the upper housing 11, not only determines the engagement position but also secures the engagement thereof with the upper housing. Moreover, the front panel provides openings where the tip of the latch lever explained in next extrudes therefrom.

Figure 6A:
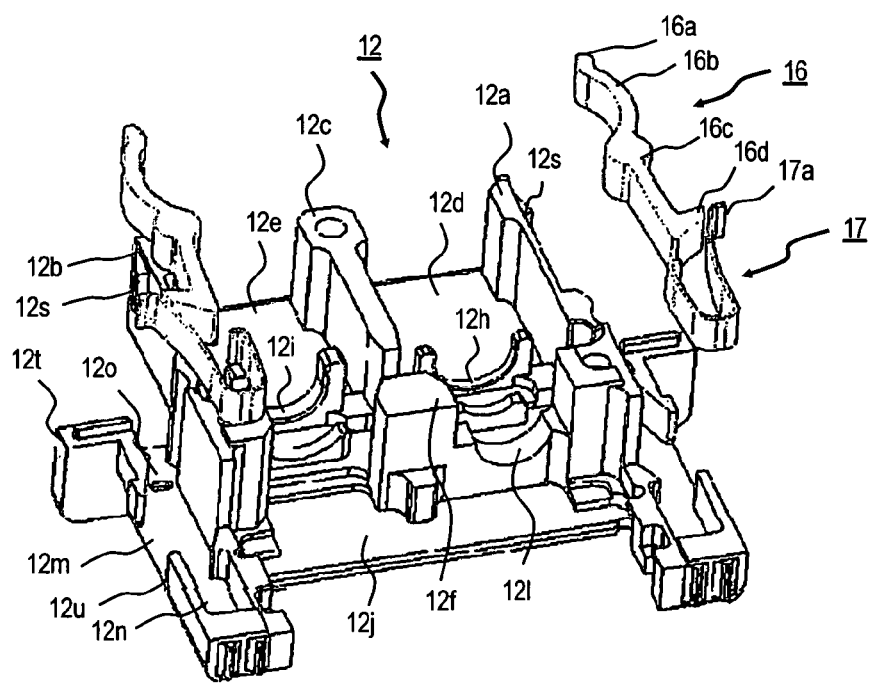
FIG. 6A is a perspective diagram of the lower housing assembled with a latch and a resilient member.
Figure 6B:
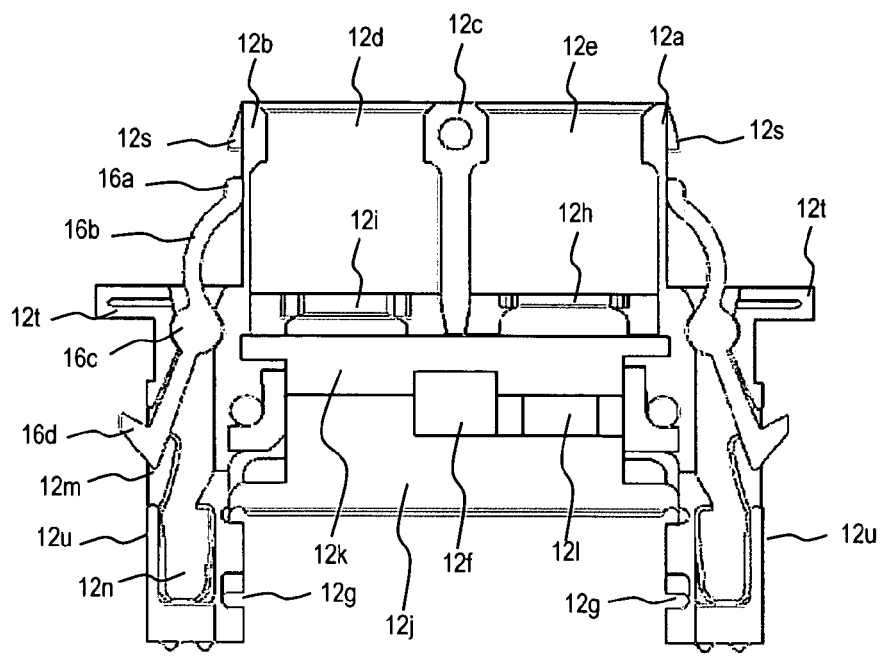
FIG. 6B is a plan view of the lower housing assembled with the latch and the resilient member.

The assembly-receiving portion 12r forms latch-lever receiving portions 12m and elastic piece receiving portions 12n. Referring to FIG. 6A and FIG. 6B, the elastic piece 17 with an U-shaped cross section, one leg thereof is longer than the other leg, a bottom portion of the U-shape is set in the elastic piece receiving portion 12n, the longer leg of the U-shape reaches the latch lever receiving portion 12m, and spreads thereat one end of the latch lever 16 in outward the lower housing 12. The latch lever 16 has a shape that on either side of the pivot 16c are a hooking end 16d in a tip of the arm and a sliding end 16a with a wavy shape in the other tip of the curved arm 16b. The latch lever is installed in the lower housing 12 such that the pivot 16c positions within the post-receiving portion 12o, the hooking end 16d is set within the latch lever receiving portion 12m by passing through the outer wall 12u, and the sliding end 16a positions the just side of the outer walls, 12a and 12b, by passing through the front panel 12t. The latch lever 16 operates as a lever such that the pivot 16c is a fulcrum, the hooking end 16d is a point of application, and the sliding end 16a is an emphasis. The latch lever 16 can make a seesaw action by effecting force accompanied with the sliding of the grip 13 in back and forth, thus the hooking end 16d, which operates as the point of action, pushes out and pulls in from the transceiver 1. The latch lever 16 is made of metal, in the present invention, the latch lever is made of aluminum coated with transceiver 1, while the elastic piece 17 is leaf spring made of stainless steel.

By spreading the hooking end 16d in outward with the elastic piece 17, the hooking end 16d protrudes from the lower housing 12 piercing the outer wall 16u of the latch lever receiving portion 12m. Consequently, as explained later, the hooking end 16d is to be latched with the edge of the opening 2 provided in the rail 2, which prevent the transceiver 1 from releasing from the rail 2. On the other hand, by spreading the sliding end 16a of the latch lever 16 in outward from the lower housing 12, the hooking end 16d thereof is brought within the lower housing 12 by the seesaw action, which releases the engagement of the hooking end 16d with the rail 2. Thus, the transceiver 1 can be released from the rail 2. The mechanism to spread the sliding end 16a of the latch lever 16 in outward can be realized by the structure formed within the grip 13, which will be explained in detail as referring to FIG. 12 and FIG. 13.

d. Assembly of the Lower Housing with the ROSA 51/TOSA 61

Figure 7B:
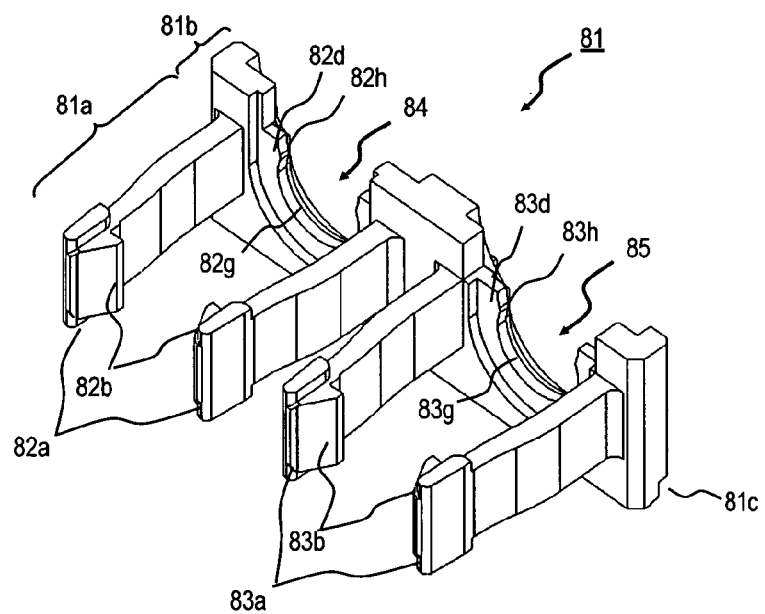
FIG. 7B is a perspective diagram of the holder form another direction.

Next, the ROSA 51 and the TOSA 61 connected with the substrate 15 by the FPC boards, 52 and 62, are assembled with the receptacle. First, the holder 81 is set within the predetermined position of the lower housing 12. FIG. 7A and FIG. 7B illustrate a detail of the holder 81. The holder 81 is formed by resin-molding integrated with the ROSA portion and the TOSA portion. The holder 81 includes a latch portion 81a and the supporting portion 81b for supporting the latch portion 81a. The supporting portion 81b provides openings, 84 and 85, for receiving the ROSA 51 and the TOSA 61, respectively. The openings, 84 and 85, continues the one edge of the supporting portion 81b. A pair of latch portions 81a extrudes from the supporting portion 81b to put the openings, 84 and 85, between the paired latch portions 81a.

The openings, 84 and 85, together with the cut connecting the opening to the edge of the supporting portion 81b has collectively semispherical shape to receive the alignment members, 51c and 61c, of the ROSA 51 and the TOSA 61. The peripheral of the opening in the supporting portion 61b is formed in relatively thin. Accordingly, steps, 82d and 83d in a side of the latch portion 81a, another steps, 82f and 83f, in the other side thereof are formed. Thus, the edges, 82g and 83g, are thinner than the supporting portion 81b. Between the steps, 82d and 83d, and the stoppers, 12h and 12i, of the lower housing are set with the flanges, 51d and 61d of the ROSA 51 and the TOSA 61. Moreover, although the openings has a semispherical shape, the top ends thereof, 82h and 83h, slightly overhang the openings, 84 and 85, which prevent the ROSA 51 and the TOSA 61 once set within the openings from slipping out therefrom. When setting the ROSA 51 and the TOSA 61 within the openings, 84 and 85, to tilt them to the supporting portion 81b makes the setting in facilitate.

The surface of the supporting portion 81b opposite to the surface from which the latch portion 81a extends provides a pair of ribs to put the openings, 84 and 85, therebetween. To abut these ribs against center post 12f of the lower housing 12 and side of the posts formed in the outer walls, 12a and 12b, fixes the ROSA 51 and the TOSA 61 by putting them between the stoppers, 12h and 12i. Moreover, the lower edge of the supporting portion 81b forms a groove 81c from the one end to the other end thereof. Within this groove 81c is filled with the electrically conductive elastic member 94.

Within the lower housing 12, in which the latch lever 16, the elastic piece 17 and the holder 81 are set in the predetermined position, the ROSA 51 and the TOSA 61 are installed such that the flanges, 51d and 61d, thereof are put between the stoppers, 12h and 12i, and the holder 81. In this process, electrically conductive elastic members are applied in advance on outsides of the paired ribs, 82e and 83e, formed in both side of the openings, 84 and 85; the edges, 82g and 83g of the openings; areas surrounding the steps, 82f and 83f continuous to these edges; and within the groove 81c of the supporting portion 81; and solidified by holding then in a high temperature. These electrically conductive elastic members show the fluidity before holding in the high temperature to apply in thin and homogeneous, while, by holding in the high temperature, converts to a solid with elasticity. Setting the ROSA 51 and the ROSA 61 within the openings, 84 and 85, this elastic member shields the transceiver 1 in electromagnetic interference at the front side thereof by crushing.

Figure 8A:
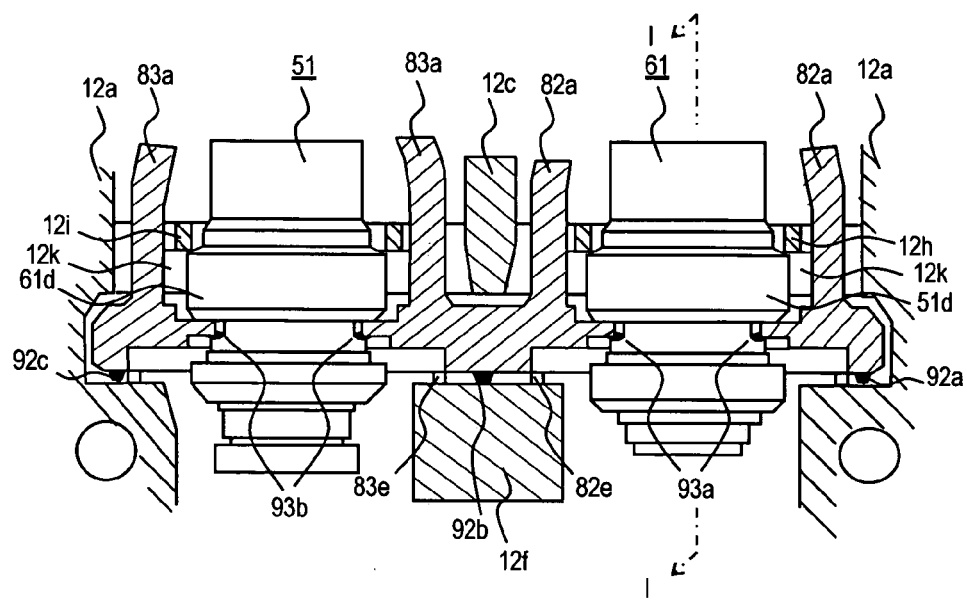
FIG. 8A shows a manufacturing step of the transceiver in which the lower housing, the holder, the transmitting optical subassembly, and the receiving optical subassembly are assembled.
Figure 8B:
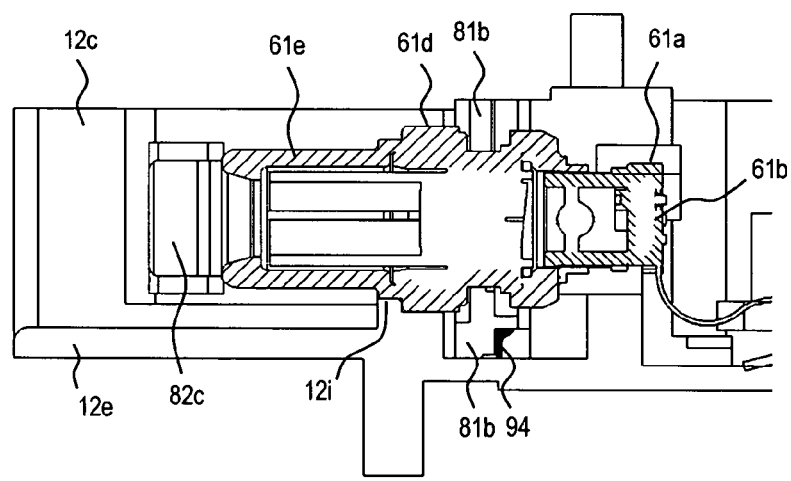
FIG. 8B is a cross section taken along the ling I—I shown in FIG. 8A.

FIG. 8A and FIG. 8B illustrates these elastic members, from 92a to 92c, 93a, 93b and 94. FIG. 8A is a plan view and FIG. 8B is a cross section taken along the line III—III appeared in FIG. 8A. These elastic members, including metals such as nickel (Ni) and silver (Ag) as an ingredient within silicone rubber, convert to a rubbery material in electrically conductive by solidifying at the high temperature. The elastic member applied and solidified at the back surface of the supporting portion 81 pushes the holder 81 frontward by its elastic force, which firmly puts the ROSA 51 and the TOSA between the stoppers, 12h and 12i. The elastic members, 93a and 93b, applied and solidified at the edges of the openings, 84 and 85, firmly fix the ROSA 51 and the TOSA 61 to the holder 81 when the upper housing 11 engages with the lower housing 12. Moreover, the holder 81 itself is firmly fixed to the lower housing 12 by the elastic member 94 when the upper housing 11 engages. Thus, these elastic members, from 92a to 92c, 93a, 93b, and 94, with electrically conductive characteristic tightly shield the frond side of the transceiver 1. Accordingly, the electromagnetic interference noise can be prevented from radiating out from the cavity formed by the upper housing 11, the lower housing 12, and the cover to the outside of the transceiver 1, and coming into the cavity from the outside.

Setting the ROSA 51 and the TOSA 61 into the lower housing 12, is carried out as the FPC boards, 52 and 62, are extended freely. After inserting the projections, 15e and 15f, formed in the front sides of the substrate 15 into the hooked groove 12g formed in both outer walls, 12a and 12b of the lower housing 12, setting the projections, 15e and 15f, in the bottom of the hooked groove 12g, the substrate 15 is pulled backward. Since the hooked groove 12g has a L-shaped groove, the substrate 15, by pulling backward after setting into the groove, is hard to be slipped off.

Figure 9A:
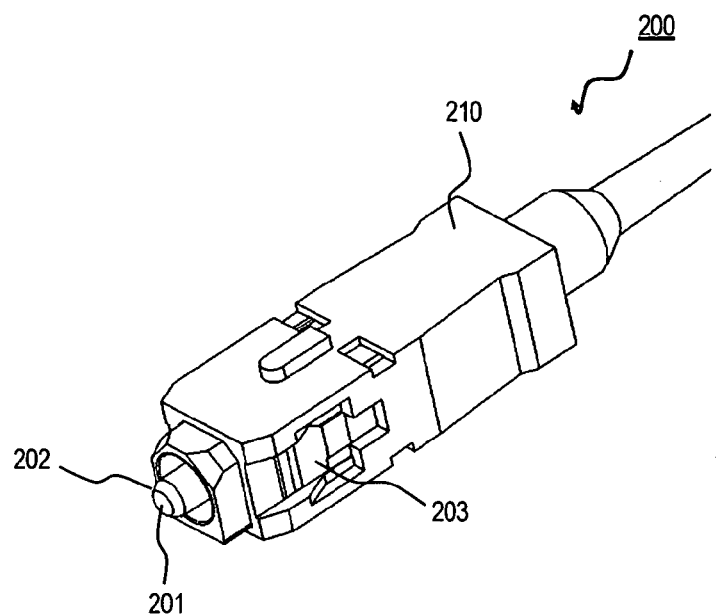
FIG. 9A is a perspective view of an optical connector mating with the optical transceiver.
Figure 9B:
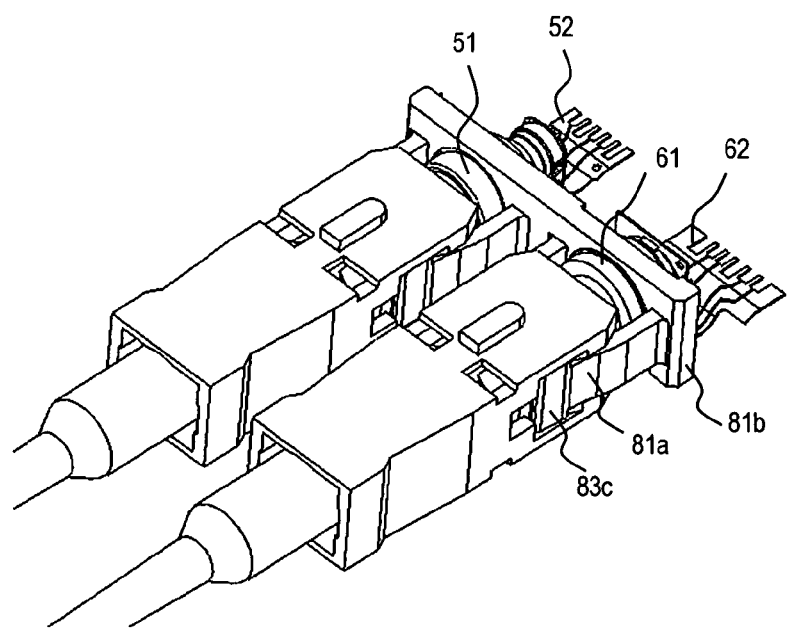
FIG. 9B shows the optical connector mating with the optical subassembly and the holder.

The latch tabs, 82a and 82b, puts the optical connector inserted into the openings, 141 and 142, therebetween and latches them, accordingly, prevents the optical connected from releasing from the openings, 141 and 142. FIG. 9A illustrates the optical connector 200 inserted into the openings, 141 and 142. The optical connector 200 includes a cover 210 with openings in both sides thereof, and a ferrule holder 203 protected by the cover 210. A center of a ferrule 202 that is held by the ferrule holder 203 exposes a tip of the optical fiber 201. The present embodiment explains a connector type of the SC-standard. Other types of standards have similar configuration shown in FIG. 9A. The cover 210 and the ferrule holder 203 may independently slide in the direction parallel to the optical axis. Both sides of the optical connector 200 expose protrusions to engage with the latch tabs, 82a and 83a, of the holder 81. As shown in FIG. 9B, the latch tabs, 82a and 83a, put the optical connector 200 therebetween and engage with these protrusion of the optical connector 200. To slide the cover 210 backward spreads the latch tabs, 82a and 83a, outwards to disengage the protrusions of the optical connector with and these latch tabs.

f. Assembly of the Upper Housing 12

After the assembly of the holder 81, the ROSA 51 and the TOSA 61, and the substrate 15, the heat-dissipating sheet 73, the bush 74 and the absorber 75 are attached to respective positions. First, the bush 74 with a curved cross section is attached to the stems, 51b and 61b, of the ROSA 51 and the TOSA 61. For the TOSA 61, the alignment member thereof is sandwiched by the bush 74 set in advance between the saddle 121 and the TOSA 61 and another bush 74 set in this process.

Next, the heat-dissipating sheets cover the whole top surface of the main amplifier 77 and the serial-to-parallel converter 71. These heat-dissipating sheets, each made of resin, have relatively superior thermal conductivity of about 6.5 W/m/K. The absorber 75 set on the substrate 15 to cover the area connecting the driver IC 76 to the portion 15h, where the TOSA 61 is attached. The driver IC 76 switches a large current over few tenth of mill ampere by a signal frequency higher than 1 GHz when it drives, for example, a semiconductor laser diode, and is the most apt circuit to generate the electromagnetic induced noise. To cover the drive IC 76 with the absorber 75 makes it possible to shield the EMI noise.

Figure 10:
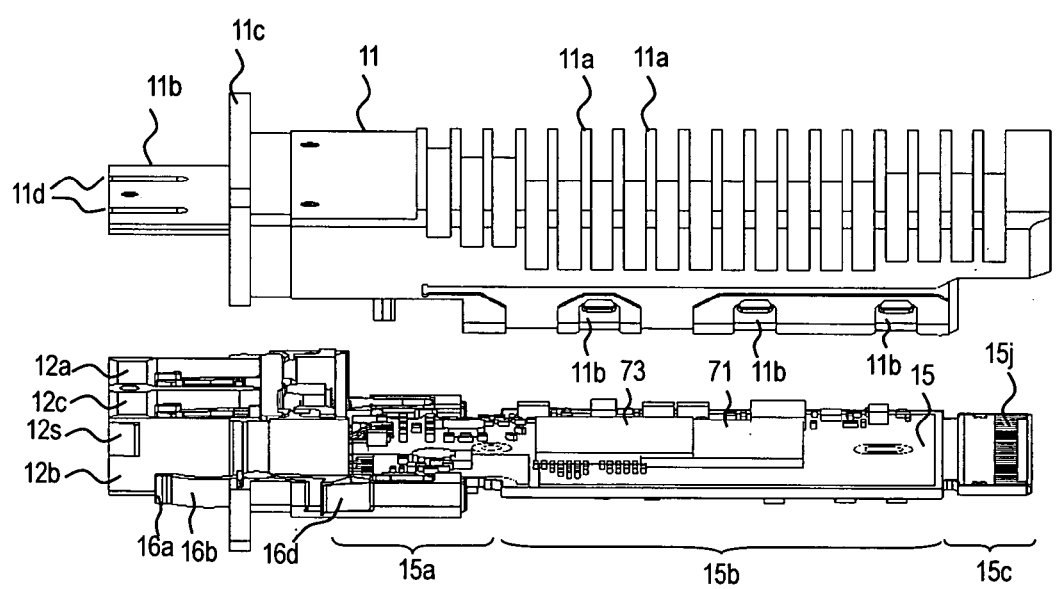
FIG. 10 is a perspective diagram showing the holder, the transmitting optical subassembly, the receiving optical subassembly, the circuit board, and the upper housing assembled to each other.

After attaching the sheets, as shown in FIG. 10, the upper housing 11 engages with the ROSA 51 and the TOSA 61, the substrate 15, the holder 81 and the lower housing 12, these are assembled in advance to the present step. The upper housing 11 is made of aluminum coated with nickel (Ni). The upper housing 11 provides a lid 11b to cover the openings, 141 and 142, in the front side thereof, and, by passing the flange 11c mating with the front panel 12t of the lower housing 12, provides a heat-dissipating portion having a plurality of heat-radiating fins 11a in the rear side thereof. Inner side of the upper housing 11 is formed in deep at the front side neighbor to the flange 11c and has a shallower in depth as closing to the rear. Accordingly, the length of the fin 11a is shorter in the front side and longer in the rear side. The heat-dissipating sheet 73, the bush 74 and the absorber 75 attached in the previous step are directly in contact with the inner surface of the upper housing 11. Both sides of the heat-dissipating portion in the bottom side thereof form a plurality of openings that engages with the tab 14b of the cover 14.

The screw fixes the lower housing 11 and the substrate 15 to the upper housing 12. Cuts 15d formed in the both sides of the substrate 15 receive the projections formed in the rear inner surface of the upper housing 11, which determines the relative position between the substrate 15 and the upper housing 11. Then, the ROSA 51 and the TOSA 61 are fixed to the upper housing 11 together with the lower housing 12. Accordingly, when the substrate is also fixed to the upper housing 12, the positional discrepancy may occur between the assemblies, 51 and 61, and the substrate 15 due to the tolerance of respective members. However, in the present embodiment, the FPC board connecting the ROSA 51 and the TOSA 61 to the substrate 15 can compensate this tolerance. The deep end of the substrate 15 forms the electrical plug connector 15j to transfer the electrical signal and the power lines to the host system. By setting the length of respective patterns of this plug connector 15j, the order to be in contact with the corresponding electrode of the electrical connector 5 in the host system among the patterns of the plug connector 15j can be adjusted. Therefore, by setting the patterns for the ground and for the power lines long, the pattern for the signal line can conduct after setting the ground and the power lines, which realizes the so-called hot-pluggable function.

g. Assembly of the Cover 14

Figure 11A:
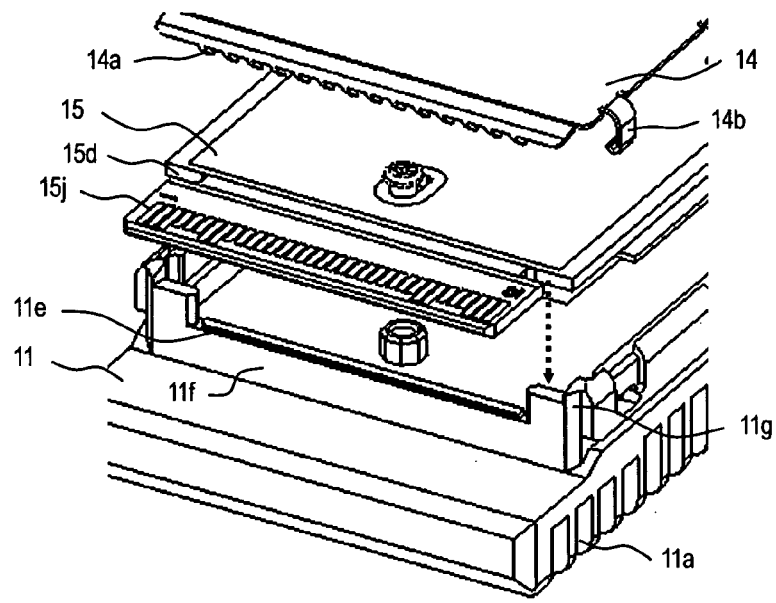
FIG. 11A shows a manufacturing step for attaching a cover to thus assembled the holder, the transmitting optical subassembly, the receiving optical subassembly, the circuit board, and the upper housing, in particular.
Figure 11B:
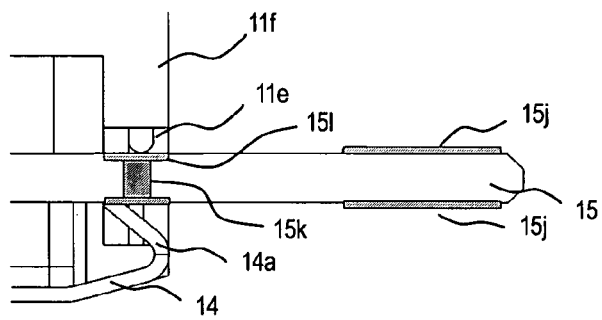
FIG. 11B is a cross section of the electromagnetic shielding shown in FIG. 11A.

Next, the cover 14 is assembled with the upper housing 11. The cover, made of copper (Cu) based alloy coated with nickel (Ni), provides a kapton™ tape and a heat-dissipating sheet in the inside thereof in advance, which is effective for the heat dissipation from the devices mounted on the substrate 15 by coming in contact directly thereto. The cover has a plurality of tabs 14a in the front end, the rear end, and both sides of the front, which slips under the upper housing 11 and the lower housing 12 to shield the substrate 15 and the electronic circuit mounted on the substrate 15 from the outside. FIG. 11A expands the portion of the plug connector 15j in the rear end, which illustrates the shielding in that portion, FIG. 11B is a cross section thereof, and FIG. 11C shows one modification of the shielding structure.

As shown in FIG. 1A, the notch 15d formed in the rear of the substrate 15 engages with the projection 11g formed in the rear of the upper housing 11, which determines the position of the substrate 15. Since the projection 11g is formed in the rear end of the upper housing 11, the portion behind the notch 15d of the substrate 15 exposes from the upper housing 11. In the present transceiver, the upper housing 1 forms a groove in the deepest rear wall 11f, which continues to the projection 11g, filled with a conductive gasket lie. On the other hand, the cover forms a plurality of tabs 14a in the rear end thereof, which puts the substrate 15 between the gasket lie. Moreover, ground patterns 151 are formed on the top and bottom surfaces of the substrate 15 where these tabs 14a and the gasket 11e are in contact thereto. By connecting these ground patterns 151 in the top and bottom surfaces of the substrate 15 with a plurality of via holes 15k, the shielding structure for the rear of the transceiver can be realized. Interconnections from the signal pad of the plug connector 15j can be guided into the transceiver without any restriction of the shielding structure, for example, in the case that the substrate 15 is a multi-layered substrate, by passing between ground via holes 15k on the inner substrate.

Figure 11C:
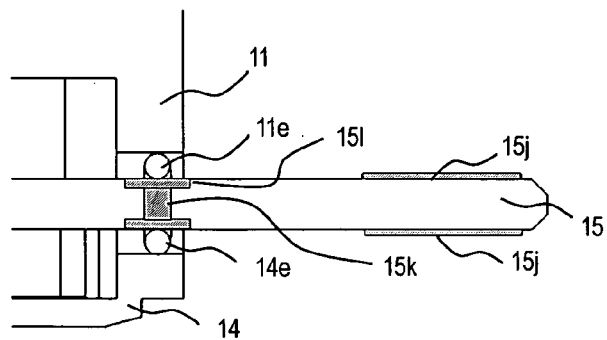
FIG. 11C shows a modification of the electromagnetic shielding.

FIG. 11C illustrates one modification of the shielding structure. In this modification, the cover 14 provides, in the rear end thereof, a gasket similar to that of the upper housing 11 instead of the plurality of tabs 14a. When the cover 14 provides the tabs 14a, a leak in the high frequent signal may occur between the tabs 14a. However, in the present configuration, the cover 14 also provides a structure using the gasket 14e, accordingly, the leak in the high frequency signal cane substantially prevented.

h. Assembly of the Grip 13 and the Gasket

Finally, the grip 13 is assembled with the lower housing 12 and the gasket 91 is put behind the flange formed by the integration of the upper 11 and the lower 12 housings. The gasket, made of resin with metal coating on the surface thereof, is to be put between the transceiver 1 and the faceplate 5 of the host system when the transceiver 1 is installed on the host system. This gasket 91, not only effectively shields the opening formed in the faceplate into which the transceiver 1 is inserted, but also gives the repulsive force due to the elasticity inherent in the resin material to the transceiver to push out from the rail 2, when the mating therebetween is released.

Figure 13A:
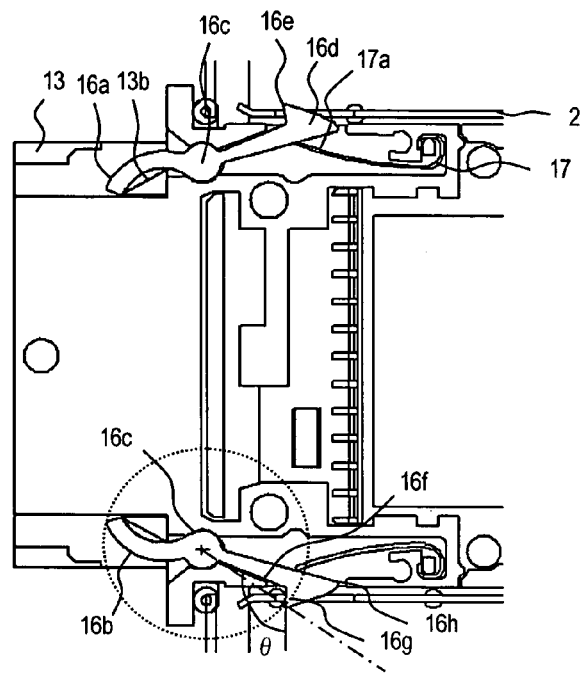
FIG. 13A shows a mechanism of the grip, the latch, and the resilient member, when the optical transceiver is put on the rail of the host system, and FIG. 13B explains the de-latching mechanism of the latch from the rail by the grip.
Figure 13B:
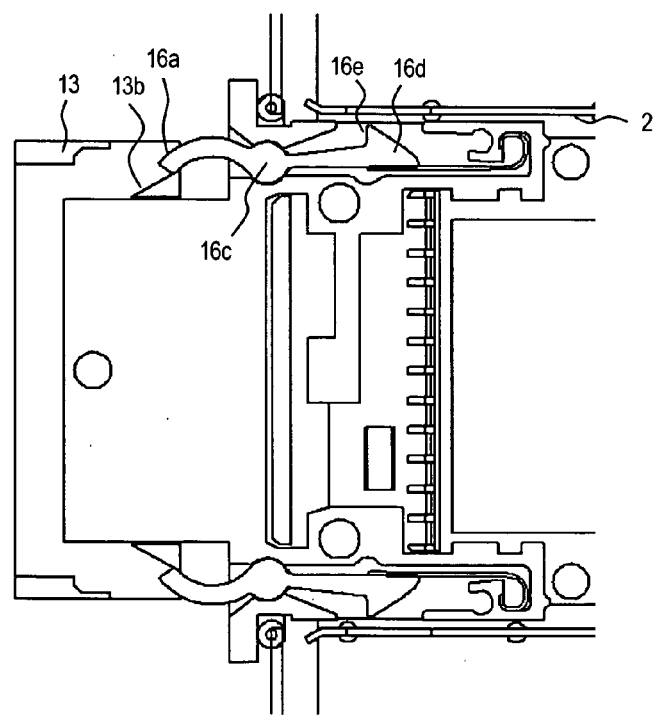
Figure 14:
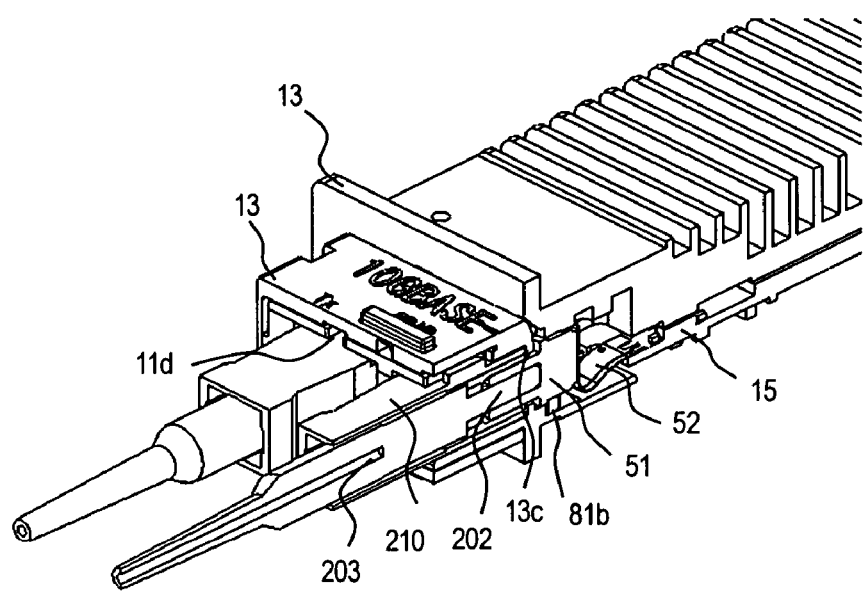
FIG. 14 shows a positional relation of the grip and the optical connector when the optical connector is mated with the optical receptacle.

Next, as referring form FIG. 12 to FIG. 14, the structure of the grip 13 and the releasing mechanism of the transceiver 1 from the rail 2 will be described in detail.

Figure 12A:
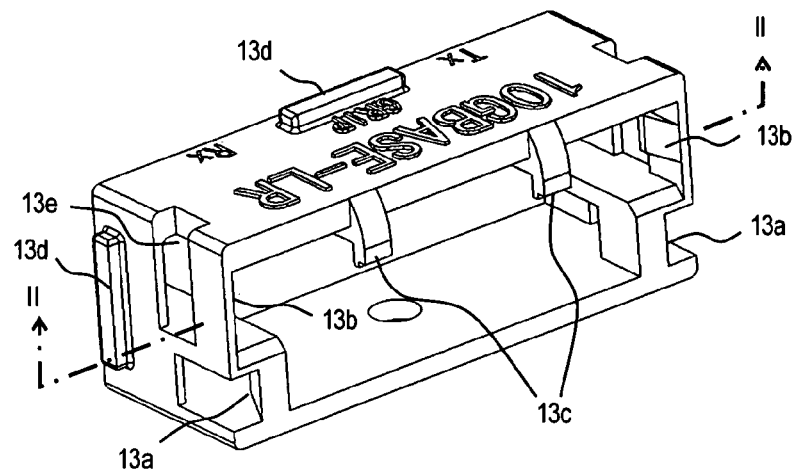
FIG. 12A is a perspective view showing a grip constituting the optical transceiver of the invention.
Figure 12B:
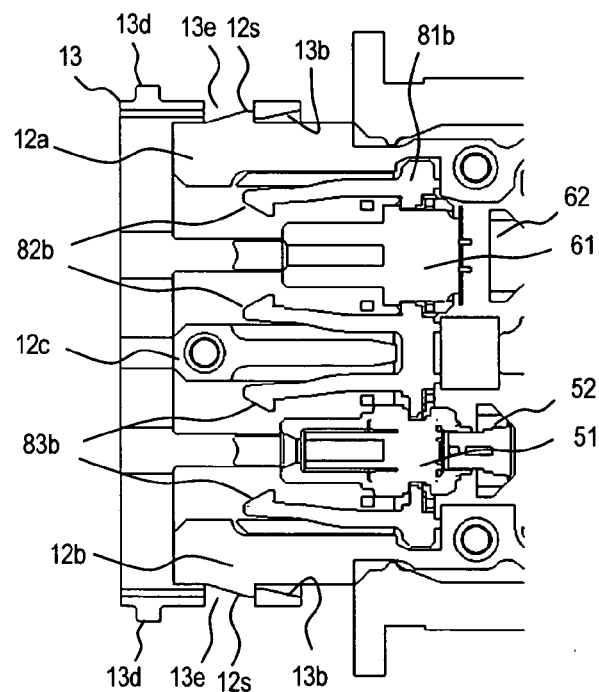
FIG. 12B is a cross section showing the grip set within the optical receptacle.

The lower housing 12 assembles the grip 13 to release the latch lever 16 of the transceiver 1 from the rail 2 of the host system, when the transceiver 1 is inserted into the rail 2 and the latch lever 16 engages with the opening formed in both sides of the rail 2. FIG. 12A is a perspective view of grip 13 itself while FIG. 12B is a cross section taken along the line II-II shown in FIG. 12A to appear the condition of the grip 13 and the lower housing 12 assembled to each other. The grip 13 is a box shape opened in both ends thereof. In FIG. 12A, the front side in the figure is to be connected to the upper 11 and the lower 12 housings. In the upper portion forms an opening 13e in the side wall there of and a wedge portion 13b with a slant surface closer to this opening 13e. On the other hand, the grip provides a hollow 13a with a surface slant toward the inside of the grip 13 in the lower portion of the side wall. Moreover, the front side of the upper wall forms, in both the transmitter side and the receiving side, a projection 13c to protrude within the opening of the grip 13.

FIG. 12B shows the grip 13 assembled with the lower housing 12. Inserting the grip 13 into the receptacle formed by the lower housing 12 together with the upper housing 11 from the front side of the transceiver 1, the wedge portion 13b formed inside of the opening of the grip 13 first comes in contact to the projection 12s formed in the side walls, 12a and 12b of the lower housing 12. Since the projection 12s and the wedge portion 13b have the slant surface facing to each other, the grip 13 engages with the receptacle as both side walls of the grip 13 widen. When the projection 12s of the lower housing 12 reaches the opening 13e of the side wall of the grip 13, the engagement between the projection 12s and the opening 13e occurs to block the release of the grip 13 from the receptacle. That is, the projection 12s operates as a stopper for the grip 13. The motion of the grip 13 relative to the transceiver 1 is not obstructed until the tip of the grip 13 comes in contact to the flange of the transceiver 1.

Next, the sliding motion of the grip and the mechanism to release the transceiver 1 from the rail 2 will be described. FIG. 13A is a cross section when the transceiver 1 engages with the rail 2, while FIG. 13B is the cross section when the engagement therebetweeen is released.

In the case that the transceiver 1 engages with the rail 2, the hooking end 16d of the latch lever 16 is pressed outward by the elastic piece 17, and the hook 16e formed in the tip of the hooking end 16d is latched with the window in the rail 2. Accordingly, the transceiver 1 tries to be extracted from the rail 2 under the above condition, the hook 16e, engaged with the window of the rail 2, prevents the transceiver 1 from releasing from the rail 2.

Sliding the grip 13 to be pulled from the transceiver 1, the sliding end 16a of the latch lever 16 slides on the inclined surface of the hollow 13a formed in the lower part of the side wall of the grip to widen the space between the sliding ends 16a. Since the pivot 16c of the latch lever 16 is fixed and moving the seesaw action by this pivot 16c as the fulcrum, the hooking end 16d thereof is drawn inside of the transceiver 1, which disengages the hook 16e with the window of the rail 2 to enable the transceiver from releasing from the rail 2.

For an angle of the hook 16e caught by the window of the rail 2, it is preferable that, when the hook 16e is pushed out to the maximum, the hook 16e makes a substantial angle, nonparallel, to a direction perpendicular to the rail 2. That is, in FIG. 13A, the hook 16e has a plane 16f connecting to the pivot 16c thereof, and another plane 16g extending from the hook 16e and to be latched with the rail 2. When an angle between two planes, 16f and 16g, is greater than a right angle, the surface 16g may not prevent the latch lever 16 from rotating. Moreover, when the latch lever 16 engages with the rail 2, and the angle between the plane 16g and the rail 2, viewed from the plane 16f, is smaller than a right angle, the latch lever 16 can not be pulled inside the transceiver 1 without sliding the grip 13.

The hooking end 16d of the latch lever 16 has a V-shape toward the host system. The interval between the tip of this V-shaped hooking end is set to be wider than a width of the opening of the face panel 5 when the latch lever 16 together with the elastic piece 17 is in initial position, i.e., the tip of the hooking end 16d is widened at the maximum outwardly by the elastic piece 17. Accordingly, the insertion of the transceiver 1 into the rail 2 is facilitated by the hooking end 16d of the latch lever as a guide.

When the transceiver 1 is free, i.e., the engagement with rail 2 is released, and even the grip 13 is pulled this side to put the latch lever 16 inside of the transceiver 1, as shown in FIG. 13B, the elastic piece always spreads the hooking end 16d outward, accordingly, pulls the sliding end 16 opposite to the hooking end inward by the seesaw action. This action drives the grip to slide toward the flange of the transceiver 1 by the interaction between the hooking end 16d and the inclined surface 13b of the grip 13. Therefore, when the transceiver 1 is free from the rail 2, the grip 13 always takes its position to be in contact with the flange of the transceiver 1. That is, the grip is automatically positioned in the deepest end thereof. Only when the grip is pulled this side to release the transceiver 1 from the rail 2, the sliding end 16a of the latch lever 16 positions in the top of the inclined surface 13b.

A standards regarding to the optical transceiver 1 rules that, when the optical connector 200 mates with the receptacle, the engagement between the transceiver 1 and the rail 2 must not release to each other. The optical transceiver 1 according to the present invention realizes this request by the projection 13c provided in the grip 13. That is, as shown in FIG. 14, the projection 13c is in contact to the cover and the front end of the ferrule holder 203. In this condition, sliding the grip 13 to release the engagement of the transceiver 1 with the rail 2, the optical connector 200 can not disengage with the subassemblies, 51 and 61, although the ferrule holder 203 of the optical connector 200 is to be disengaged with the assemblies, 51 and 61, by the projection 13c of the grip, because the ferrule holder 203 engages with the latch tabs, 82a and 83a, within the receptacle.

Thus, as explained before, the optical transceiver providing the structure according to the present invention is capable of not only engaging with the rail of the host system but also disengaging with the rail in ease. Moreover, the EMI shielding can be realized by interposing the conductive elastic member and the conductive gasket to assemble the parts such as optical subassembly within the transceiver, and the mechanical robustness can be enhanced.

What is claimed is:

1. An optical transceiver for receiving an optical connector, said optical transceiver being pluggable to a host system that provides a rail system having a pair of rails between which said optical transceiver is inserted, said optical transceiver comprising:
   a mechanism for latching and de-latching said optical transceiver with said rail system, said mechanism including,
   a latch lever with a pivot, a sliding end, and a hooking end, said sliding end and said hooking end pivotally moving around said pivot, and
   an elastic member for pushing said hooking end toward the outside of said optical transceiver; and
   a grip slidable along a direction where said optical connector is received for manipulating said latch lever, said grip including a sliding surface inclined along said direction, said hooking end being drawn within said optical transceiver by sliding said sliding end on said sliding surface as said grip is being slid,
   wherein said grip takes a closest position to said elastic member when said optical transceiver is free from said rail system and said optical connector is released from said optical transceiver.

2. The optical transceiver according to claim 1,
   wherein said latch lever includes an arm connecting said pivot to said sliding end, said arm having a convex shape protruding toward the outside said optical transceiver.

3. The optical transceiver according to claim 1,
   wherein said hooking end provides a hook formed by a first surface connected to said pivot and a second surface to be mated with said rail, and
   wherein said first surface, when said hook mates with said rail, makes an angle to said second surface greater than a right angle and smaller than a total angle of a right angle and an angle between said first surface and said rail.

4. An optical transceiver for receiving an optical connector, said optical transceiver being pluggable to a host system that provides a rail system having a pair of rails between which said optical transceiver is inserted, said optical transceiver comprising:
   a lower housing having a mechanism for latching said optical transceiver with said rail system;
   an upper housing for forming an optical receptacle co-operating with said lower housing;
   an optical assembly having an optical axis connecting said optical assembly to said optical connector to be received in said optical receptacle;
   a holder for fixing said optical assembly to said lower and upper housings and for latching said optical connector in said optical receptacle; and
   a grip slidable along said optical axis and adapted to surround said optical receptacle for manipulating said mechanism,
   wherein said grip takes a closest position to said optical receptacle when said optical transceiver is free from said rail system and said optical connector is released from said optical receptacle.

5. The optical transceiver according to claim 4,
   wherein said mechanism includes a latch lever and an elastic member, said latch lever having a pivot, a sliding end, and a hooking end, said sliding end and said hooking end pivotally moving around said pivot, and
   wherein said grip includes a sliding surface inclined along said optical axis, said grip taking a closest position as said elastic member pushes said hooking end towards the outside of said transceiver to slide said sliding end on said sliding surface.

6. The optical transceiver according to claim 5,
   wherein said latch lever includes an arm connecting said pivot to said sliding end, said arm having a convex shape protruding toward the outside of said optical transceiver.

7. The optical transceiver according to claim 5,
   wherein said hooking end provides a hook formed by a first surface connected to said pivot and a second surface to be mated with said rail, and
   wherein said first surface, when said hook mates with said rail, makes an angle to said second surface greater than a right angle and smaller than a total angle of a right angle and an angle between said first surface and said rail.

8. The optical transceiver according to claim 5,
   wherein said lower housing includes a latch lever receiving portion in an outer side of said lower housing, said latch lever receiving portion including an exterior wall and a front wall, and
   wherein said hooking end protrudes from said exterior wall to mate with said rail and said sliding end protrudes from said front wall to co-operate with said grip.

9. The optical transceiver according to claim 4,
   wherein said mechanism includes a pair of latch levers and a pair of elastic members, each latch lever having a pivot, a sliding end, and a hooking end with a tip, said sliding end and said hooking end pivotally moving around said pivot, a span between said tips being narrower than a span of said rails when said optical transceiver is free from said rail, and
   wherein said grip includes a pair of sliding surfaces each inclined along said optical axis, said grip taking a closest position as said elastic member pushes said hooking end towards the outside of said transceiver to slide said sliding end on said sliding surface.

* * * * *